(12) United States Patent
Krug et al.

(10) Patent No.: US 11,569,798 B2
(45) Date of Patent: Jan. 31, 2023

(54) DIFFERENTIAL TECHNIQUES FOR MEASURING VOLTAGE OVER A POWER SWITCH

(71) Applicant: Infineon Technologies AG, Neubiberg (DE)

(72) Inventors: Michael Krug, Munich (DE); Matthias Weinmann, Munich (DE); Marco Bachhuber, Neuried (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/356,114

(22) Filed: Jun. 23, 2021

(65) Prior Publication Data

US 2022/0416766 A1 Dec. 29, 2022

(51) Int. Cl.
*H03K 3/011* (2006.01)
*H03K 17/687* (2006.01)

(52) U.S. Cl.
CPC ......... *H03K 3/011* (2013.01); *H03K 17/6874* (2013.01)

(58) Field of Classification Search
CPC .......................... H03K 3/011; H03K 17/6874
See application file for complete search history.

(56) References Cited

U.S. PATENT DOCUMENTS

| | | |
|---|---|---|
| 9,634,657 B1 | 4/2017 | Zoels et al. |
| 9,831,824 B2 * | 11/2017 | Gazit ....................... H02J 3/383 |
| 10,020,802 B2 | 7/2018 | Zhao et al. |
| 10,367,407 B2 | 7/2019 | Geske |
| 10,516,392 B2 | 12/2019 | Sicard |
| 10,784,857 B1 | 9/2020 | Li et al. |
| 2008/0007318 A1 | 1/2008 | Pace et al. |
| 2018/0219543 A1* | 8/2018 | Komo ................... H03K 17/567 |
| 2019/0204889 A1* | 7/2019 | Kaeriyama .............. G01K 7/01 |
| 2020/0021284 A1 | 1/2020 | Thalheim |

FOREIGN PATENT DOCUMENTS

| | | |
|---|---|---|
| EP | 1310045 A1 | 5/2003 |
| WO | 2020207575 A1 | 10/2020 |

OTHER PUBLICATIONS

U.S. Appl. No. 17/189,607, filed Mar. 2, 2021, naming inventors Bacigalupo et al.
U.S. Appl. No. 17/189,641, filed Mar. 2, 2021, naming inventors Krug et al.

* cited by examiner

*Primary Examiner* — Ryan Johnson
*Assistant Examiner* — Colleen J O Toole
(74) *Attorney, Agent, or Firm* — Shumaker & Sieffert, P.A.

(57) ABSTRACT

A driver circuit is configured to deliver drive signals from an output pin to a power switch to control ON/OFF switching of the power switch. A first detection pin of the driver circuit is configured to receive a first signal associated with the power switch, wherein the first signal indicates a voltage drop over the power switch and a voltage drop over one or more other circuit elements. A second detection pin is configured to receive a second signal, wherein the second signal indicates a voltage drop over one or more matched circuit elements, wherein the one or more matched circuit elements associated with the second signal are substantially identical to the one or more other circuit elements associated with the first signal. The driver circuit is configured to determine the voltage drop over the power switch based on a difference between the first signal and the second signal.

22 Claims, 6 Drawing Sheets

DIFFERENTIAL TECHNIQUES FOR MEASURING VOLTAGE OVER A POWER SWITCH

TECHNICAL FIELD

This disclosure relates to power switches, and more specifically, techniques and circuits for monitoring the operation of power switch circuits.

BACKGROUND

Power switches are used in a wide variety of applications in order to control power being delivered to a load. As examples, a power switch may comprise a Field Effect Transistor (FET), a bipolar junction transistor (BJT), a gallium nitride (GaN) switch, a silicon carbide (SiC) switch, or possibly a silicon-controlled rectifier (SCR). Examples of FETs may include, but are not limited to, junction field-effect transistor (JFET), metal-oxide-semiconductor FET (MOSFET), dual-gate MOSFET, insulated-gate bipolar transistor (IGBT), any other type of FET, or any combination of the same. Examples of MOSFETS may include, but are not limited to, PMOS, NMOS, DMOS, or any other type of MOSFET, or any combination of the same. MOSFETs may be formed in silicon, gallium nitride, silicon carbide, or other materials. Examples of BJTs may include, but are not limited to, PNP, NPN, heterojunction, or any other type of BJT, or any combination of the same.

Power switches are typically controlled by a driver circuit via a modulation control signal, such as pulse width modulation (PWM), pulse frequency modulation (PFM), pulse duration modulation, pulse density modulation, or another type of modulation control signal. Modulation control signals can be applied to the gate of a power switch so as to control on/off switching of the power switch, and thereby control the average amount of power delivered through the power switch to a load. The on/off switching of the power switch effectively chops its power delivery up into discrete parts. The average value of voltage and/or current fed to a load can be controlled by turning the switch on and off at a fast rate. The longer the switch is on compared to the off periods, the higher the total power supplied to the load. In many applications, two different power switches are configured in a high-side and low-side configuration, and the on/off switching of the two power switches is synchronized in order to deliver the desired power to a switch node positioned between the high-side and low-side switch. Moreover, in some system, different sets of high-side and low-side switches may be used to control different phases of a multi-phase electrical motor.

The ability to detect the junction temperature associated with a power switch is highly desirable. To do so, conventional techniques often use external components, such as negative temperature coefficient (NTC) thermistors or semiconductor-based temperature sensors (e.g., temperature sensitive diodes) that are mounted close to the power switch. Unfortunately, these conventional techniques can be imprecise and may result in delayed reactions to temperature-related problems with the switch. For example, external components may measure the temperature of the housing of the switch or a temperature close to the switch with a certain intrinsic delay, but these measurements are not always precisely indicative the junction temperature within the power switch itself.

SUMMARY

In general, this disclosure describes circuits and techniques that are applied by a driver circuit in controlling a power switch. The circuits and techniques can provide protection against power switch malfunction, which may be desirable in a wide variety of circuit applications, especially in settings where safety is a concern. The circuits and techniques can facilitate very accurate voltage measurements of the voltage drop over a power switch. In some cases, the accurate voltage measurements can be used by a driver circuit to detect problems in circuit operation, e.g., a safety check or disaster check on power switch operation. Moreover, in some cases, the accurate voltage measurements can be communicated to a controller (along with current measurements), so that the controller can use these measurements in controlling switch operation, performing safety or disaster checks, or possibly to determine the resistance of the power switch based on Ohm's law. The resistance, in turn, can be mapped to an indication of temperature of the power switch which may be a more precise indication of junction temperature of the power switch that can be achieved using other techniques. Accordingly, in some examples, the techniques can facilitate very accurate measurements of the junction temperature of a power switch.

In one example, this disclosure describes a driver circuit configured to control a power switch. The driver circuit comprises an output pin, wherein the driver circuit is configured to deliver drive signals from the output pin to the power switch to control ON/OFF switching of the power switch; a first detection pin configured to receive a first signal associated with the power switch, wherein the first signal indicates a voltage drop over the power switch and a voltage drop over one or more other circuit elements; and a second detection pin configured to receive a second signal, wherein the second signal indicates a voltage drop over one or more matched circuit elements, wherein the one or more matched circuit elements associated with the second signal are substantially identical to the one or more other circuit elements associated with the first signal. The driver circuit may be configured to determine the voltage drop over the power switch based on a difference between the first signal and the second signal.

In another example, this disclosure describes a system comprising a controller, and a driver circuit configured to control a power switch based on control signals from the controller. The driver circuit comprises an output pin, wherein the driver circuit is configured to deliver drive signals from the output pin to the power switch to control ON/OFF switching of the power switch; a first detection pin configured to receive a first signal associated with the power switch, wherein the first signal indicates a voltage drop over the power switch and a voltage drop over one or more other circuit elements; and a second detection pin configured to receive a second signal, wherein the second signal indicates a voltage drop over one or more matched circuit elements, wherein the one or more matched circuit elements associated with the second detection pin are substantially identical to the one or more other circuit elements associated with the first detection pin. The driver circuit may be configured to determine the voltage drop over the power switch based on a difference between the first signal and the second signal and send an indication of the voltage drop to the controller.

In another example, this disclosure describes a method that comprises controlling ON/OFF switching of a power switch, and receiving a first signal associated with the power switch, wherein the first signal indicates a voltage drop over the power switch and a voltage drop over one or more other circuit elements. The method also comprises receiving a second signal, wherein the second signal indicates a voltage drop over one or more matched circuit elements, wherein the one or more matched circuit elements associated with the first signal are substantially identical to the one or more other circuit elements associated with the second signal, and determining the voltage drop over the power switch based on a difference between the first signal and the second signal.

Details of these and other examples are set forth in the accompanying drawings and the description below. Other features, objects, and advantages will be apparent from the description and drawings, and from the claims.

DETAILED DESCRIPTION

Figure 1:
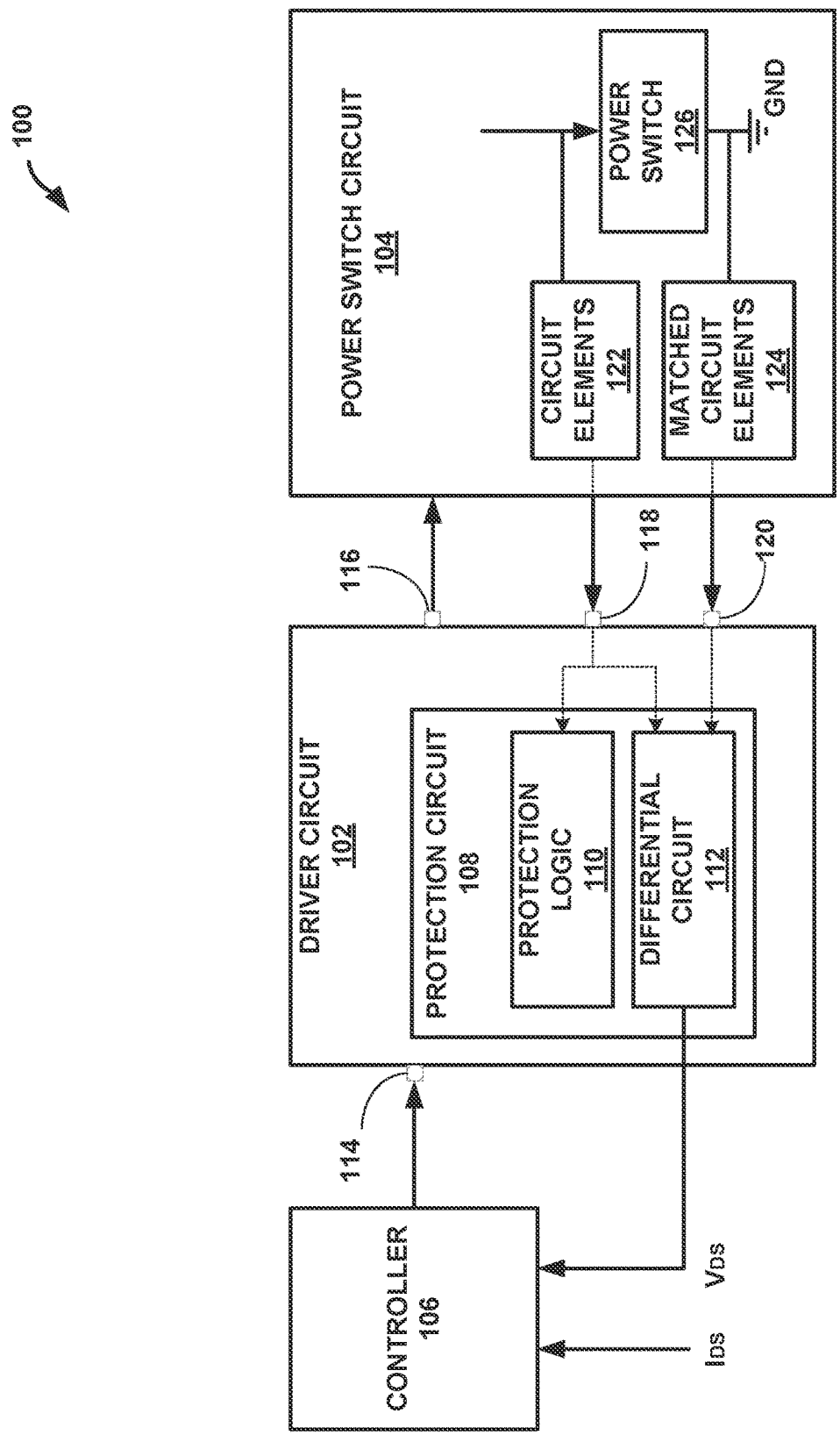
FIG. 1 is a block diagram an example system that includes a power switch circuit, a driver circuit, and a controller.

This disclosure describes circuits and techniques that are applied by a driver circuit or a larger system that controls a power switch. The circuits and techniques can provide protection against power switch malfunction, which may be desirable in a wide variety of circuit applications, especially in settings where safety is a concern. The circuits and techniques may be useful for accurately measuring a voltage drop over a power switch, and in some cases, the driver circuit or the system may control the power switch based on the measured voltage drop. Moreover, in some cases, the measured voltage drop can be used (along with a current measurement) to determine resistance in the power switch, which in turn, can be used to determine temperature of the power switch. The circuits and techniques of this disclosure may be useful in many applications, such as control over a multi-phase electrical motor of an electric vehicle or another device.

In some cases, the accurate voltage measurements can be used by a driver circuit to detect problems in circuit operation, e.g., a safety check or disaster check on power switch operation. Moreover, in some cases, the accurate voltage measurements can be communicated to a controller (along with current measurements), so that the controller can use these measurements in controlling switch operation, performing safety or disaster checks, or possibly to determine the resistance of the power switch based on Ohm's law. The resistance, in turn, can be mapped to an indication of temperature of the power switch which may be a more precise indication of junction temperature of the power switch that can be achieved using other techniques. Accordingly, in some examples, the techniques can facilitate very accurate measurements of the temperature of a power switch.

Furthermore, in some examples, techniques of this disclosure may leverage an already-existing detection pin associated with a driver circuit. The detection pin, for example, may comprise a so-called desaturation (DESAT) pin used to monitor whether a power switch is operating in a desaturation mode. If a power switch is operating in the desaturation mode, as determined by a signal on the DESAT pin, the power switch may be disabled. Moreover, according to this disclosure, the signal on the DESAT pin may be used along with another signal on a second pin, whereby one or more circuit elements associated with the second pin are selected or defined to match one or more circuit elements associated with the DESAT pin. In this case, a difference between the signal on the DESAT pin and a signal on the second pin may indicate voltage drop over the power switch, and any additional voltage drop associated with other circuit elements seen on the DESAT pin may be canceled by corresponding matched circuit elements seen on the second pin. The matched circuit elements associated with the second signal, for example, may define similar or identical temperature coefficients to the one or more circuit elements associated with the DESAT pin, and the matched elements may exhibit similar voltage drop versus current behavior to the one or more circuit elements associated with the DESAT pin. Matched circuit elements associated with the second signal, for example, may comprise circuit elements that have a same manufacturer part number as one or more circuit elements that affect the signal on the DESAT pin.

FIG. 1 is a block diagram of an example system 100 that includes a power switch circuit 104, a driver circuit 102, and a controller 106. Controller 106 may comprise a microprocessor configured to control driver circuit 102. In particular, controller 106 sends command signals to driver circuit 102 via input pin 114. Based on these command signals, driver circuit 102 sends ON/OFF signals (e.g., gate control signals via output pin 116) to power switch circuit 104 to turn the power switch ON or OFF.

Driver circuit 102 may control power switch circuit 104 via modulation signals on output pin 116, which may control the ON/OFF switching of power switch 126 within power switch circuit 104. The modulation signals, for example, may comprise pulse width modulation (PWM) signals, pulse frequency modulation (PFM) signals, pulse duration modulation signals, pulse density modulation signal, or another type of modulation control signal use to control a power transistor. In normal operation, the signals from driver circuit 102 over output pin 116 can be applied to the gate (or other control terminal) of power switch 126 within power switch circuit 104 so as to control on/off switching of power switch 126, and thereby control the average amount of power delivered through the power switch to a load (not shown in FIG. 1).

In the most general sense, driver circuit 104 may comprise any type of driver for any type of power switch, e.g., a high-side switch driver, a low-side switch driver, a driver within a flyback power converter, or any driver used in any circuit arrangement that controls ON/OFF switching of one or more power switches. In some situations, driver circuit 102 may be duplicated for controlling many switches. For example, a three-phase electric motor may be controlled by six power switches that form three half-bridges of high-side and low-side switches. In this example, the techniques of this disclosure may be performed by different driver circuits that control each of the six different power switches.

Power switch 126 may comprise a power transistor, such as a metal oxide semiconductor field effect transistor (MOSFET). The MOSFET may be formed in silicon, in which case the MOSFET may be called a silicon MOSFET. Alternatively, the MOSFET may be formed in another semiconductor material, such as silicon carbide (SiC) or gallium nitride (GaN), in which case the MOSFET may be called a SiC MOSFET or a GaN MOSFET. Indeed, the techniques of this disclosure may be especially useful for monitoring SiC MOSFETS that are used for controlling a three-phase electric motor, such as those used to power electric vehicles.

In the example shown in FIG. 1, driver circuit 102 includes protection logic 108 connected to a detection pin 118. Detection pin 118 may comprise a first detection pin, and driver circuit 102 may further comprise a second detection pin 120. In some cases, first detection pin 118 may comprise a so-called DESAT pin and protection logic 110 may be configured to determine whether a power switch 126 is operating in a desaturation mode. In this case, protection logic 110 may be configured to disable power switch 126 in response to detecting that power switch 126 within power switch circuit 104 is operating in the desaturation mode. For example, in order to detect whether power switch 126 is in the desaturation mode, protection logic 110 may be configured to compare a signal magnitude of the signal on first detection pin 118 to a desaturation threshold when the power switch is ON. The signal detected on first detection pin 118, for example, may comprise a measure of the voltage drop across the power switch 126 along with a voltage drop across other circuit elements 112 associated with detection pin 118.

According to this disclosure, in addition to checking on DESAT (or as an alternative to checking on DESAT), one or more other techniques may be performed based on a voltage signal on first detection pin 118 and second detection pin 120. First detection pin 118 may be configured to receive a first signal associated with power switch 126, wherein the first signal indicates a voltage drop over power switch 126 and a voltage drop over one or more other circuit elements 122. Second detection pin 120 may be configured to receive a second signal, wherein the second signal indicates a voltage drop over one or more matched circuit elements 124. The one or more matched circuit elements 124 associated with the second signal are substantially identical to the one or more other circuit elements 122 associated with the first signal. For example, matched circuit elements 124 associated with the second signal, may be similar or identical to circuit elements 122 and may define similar or identical temperature coefficients to the one or more circuit elements 122 associated with the first signal. Moreover, matched circuit elements 124 may exhibit similar voltage drop versus current behavior to the one or more circuit elements 122 associated the first signal. Matched circuit elements 124, for example, may comprise circuit elements that have a same manufacturer part number as circuit elements 122. In some examples, elements 124 associated with the second signal are substantially identical to the one or more other circuit elements 122 associated with the first signal, in that elements 124 nominally have the same temperature coefficient and exhibit similar voltage drop versus current behavior as circuit elements 122, but due to variations in the manufacturing process and variations caused by wear and aging, matched circuit elements 124 and circuit elements 122 may not behave in an exactly identical manner. In some examples, matched circuit elements 124 may define temperature coefficients that are similar to within 1 percent of the temperature coefficients of other circuit elements 122 when the circuit is assembled or manufactured. In any case, differential circuit 112 may be configured to determine a voltage drop over power switch 126 based on a difference between the first signal on first detection pin 118 and the second signal on second detection pin 120.

Driver circuit 102 may be configured to output an indication of the voltage drop over power switch 126 to controller 106. For example, differential circuit 112 may be configured to output signal VDs to controller 106. In addition, a current sensing unit (not shown in FIG. 1) may be configured to send a current measurement associated with current through power switch 126 to controller 106 (shown in FIG. 1 as current signal IDS).

Figure 3:
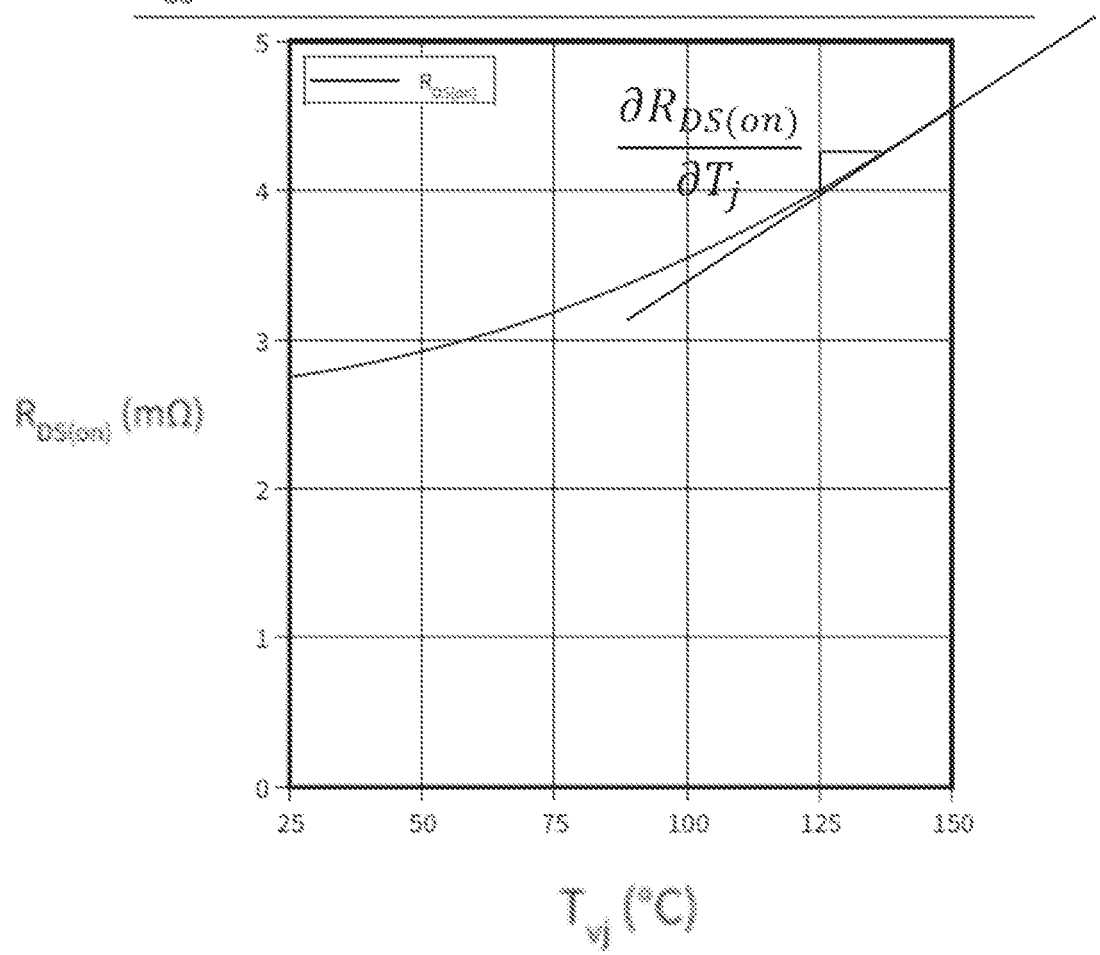
FIG. 3 showing one example relationship between resistance and juncture temperature within a power switch.

Controller 106 may be configured to receive the indication of the voltage drop (e.g., VDs), receive the indication of current (e.g., IDs), and calculate a resistance of power switch 126 based on VDS and IDS, e.g., using Ohm's law. Moreover, in some cases, controller 106 may be configured to determine a temperature of power switch 126 based on the calculated resistance. The relationship between resistance and temperature may be defined by controller 106 based on a mathematical relationship or based on a lookup table (LUT). FIG. 3, for example, is a graph showing a relationship between the junction temperature of a power switch and resistance through the power switch. This relationship or other temperature-resistance relationship can be stored in or calculated by controller 106 so that resistance measurements can be mapped to temperature by controller 106. Thus, in some cases, controller 106 may be configured to control driver circuit 102 based on the determined temperature.

In some cases, however, it may be unnecessary to calculate temperature. Instead, in some examples, the voltage measurement VDs itself may provide sufficient information for driver circuit 102 or controller 106 to make control decisions for power switch 102. For example, VDS itself may be used by driver circuit 102 or by controller 106 as a safety check or disaster check on the operational integrity of power switch 126. Thus, in some cases, controller 106 may be configured to define the control signals based on the determined voltage drop. Also, in some cases, controller 106 may be configured to disable power switch 126 based on the determined voltage drop (e.g., if the voltage drop is out of the safe operational voltage range for power switch 126). Similarly, in some cases, driver 102 may be configured to control ON/OFF switching of power switch 126 based on the determined voltage drop, and/or, in some cases, driver circuit 102 may be configured to disable power switch 126 based on the determined voltage drop (e.g., if the voltage drop is out of the safe operational voltage range of power switch 126).

Figure 2:
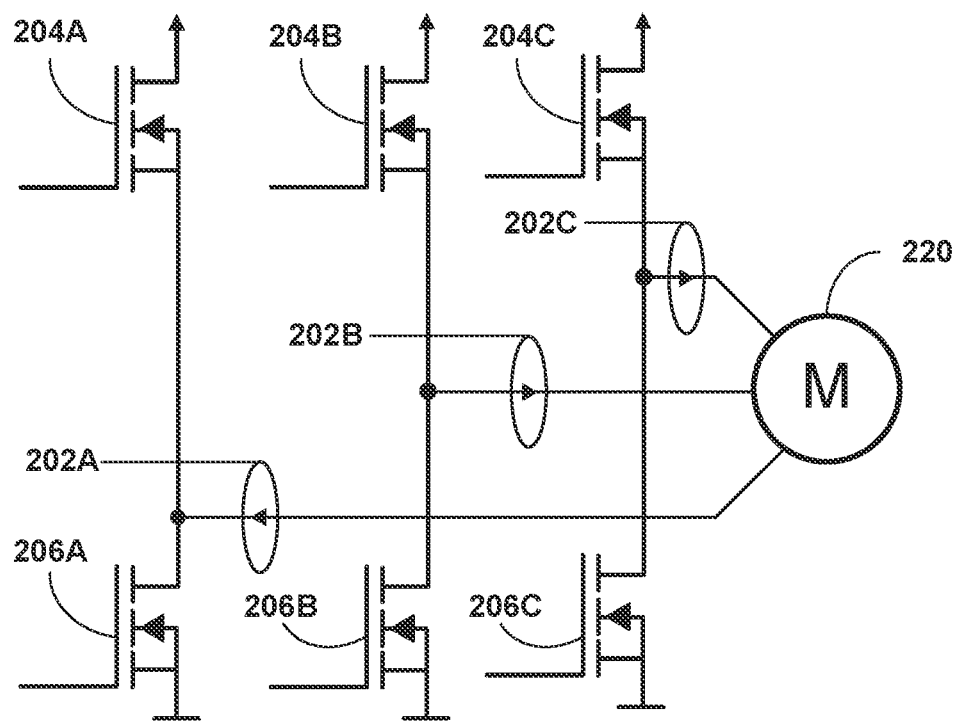
FIG. 2 is an example circuit diagram showing six power switches arranged to define three half-bridges for controlling a three-phase electric motor.

FIG. 2 is an example circuit diagram showing six power switches arranged to define three half-bridges for controlling a three-phase electric motor 220. High side switch 204A and low side switch 206A define a first half-bridge for controlling current delivered to motor 220 in a first phase. Similarly, high side switch 204B and low side switch 206B define a second half-bridge for controlling current delivered to motor 220 in a second phase. Furthermore, high side switch 204C and low side switch 206C define a third half-bridge for controlling current delivered to motor 220 in a third phase. A first current sensing unit 202A may be configured to sense the current in the first phase, a second current sensing unit 202B may be configured to sense the current in the second phase, and a third current sensing unit 202C may be configured to sense the current in the third phase. This current sensing may be used as part of a current control loop to help balance the current among the different phases. In addition, according to this disclosure, the currents sensed by current sensing units 202A, 202B, and 202C can be sent to a controller (e.g., IDS sent to controller 106 in FIG. 1) for use in performing one or more techniques of this disclosure. Each of switches 204A, 206A, 204B, 206B, 204C, and 206C may be controlled by a driver circuit (similar to driver circuit 102 of FIG. 1), and each of the driver circuits may be configured to perform the voltage detection techniques (and/or other techniques) of this disclosure.

FIG. 3 showing one example relationship between resistance and junction temperature within a power switch. As demonstrated in FIG. 3, the resistance of a power switch (shown in the Y axis) rises as a function of the junction temperature of the switch (shown in the X axis). Thus, an accurate measurement of the resistance of a power switch can be mapped to an accurate junction temperature of the power switch. Also, when there is a defined relationship between resistance and temperature, a calculated resistance could also be used as a proxy for junction temperature without actually mapping the resistance to a temperature. In some examples of this disclosure, a microcontroller (e.g., controller 106 of FIG. 1) may leverage the temperature-resistance relationship of a power switch (e.g., applying a mathematical function or a lookup table) in order to determine junction temperature of a power switch based on a calculated resistance.

Figure 4:
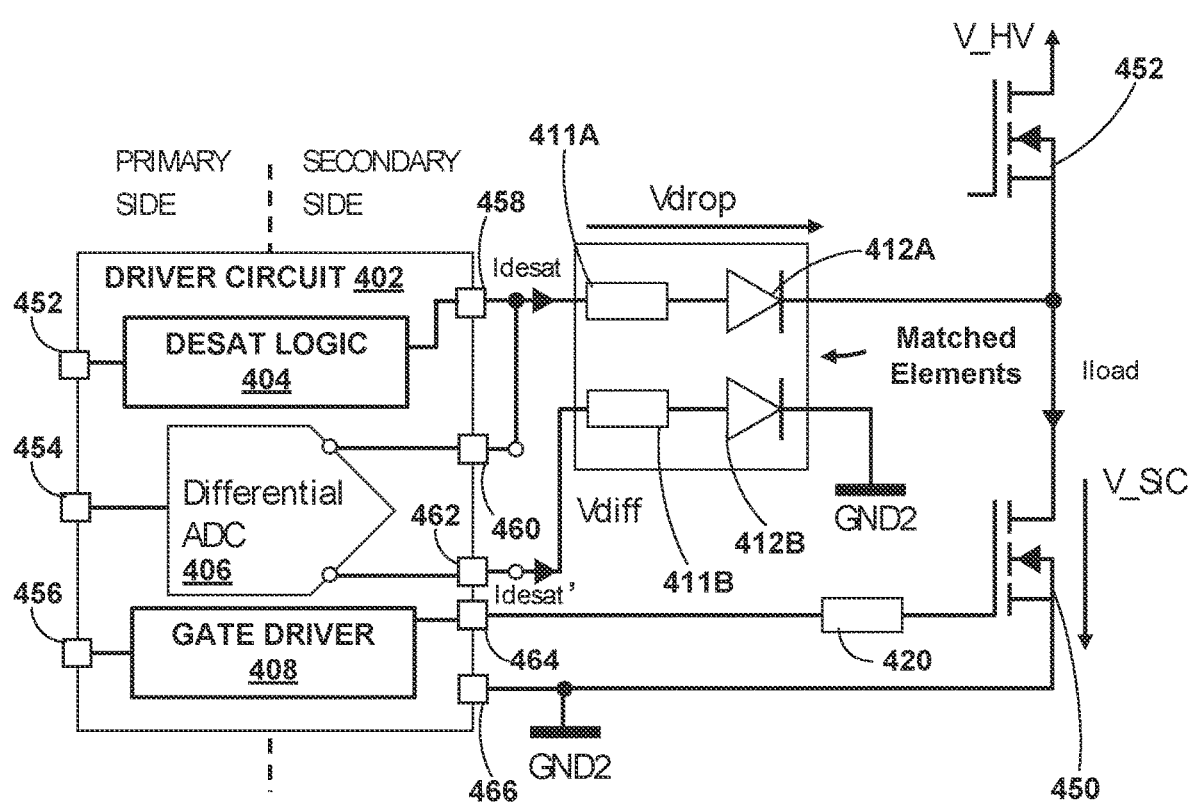
FIG. 4 is a more detailed block diagram showing one example driver circuit that controls a low-side power switch according to this disclosure.

FIG. 4 is a more detailed block diagram showing one example driver circuit 402 that controls a low-side power switch 450 according to this disclosure. In the example of controlling a three-phase electric motor, driver circuits to driver circuit 402 may be used for each of power switches 204A, 206A, 204B, 206B, 204C, and 206C shown in FIG. 2. A high-side switch 452 is shown in FIG. 4, but the high-side driver circuit is not shown in FIG. 2 for ease of illustration.

Driver circuit 402 may include a galvanic isolation barrier between a primary side and a secondary side of driver circuit 402. The primary side may operate in a lower voltage domain than the secondary side. Each of the different components within driver circuit 402 may include the galvanic isolation barrier. The galvanic isolation within the components of driver circuit 402 (e.g., DESAT logic 404, differential ADC, and gate drier 408) may use one or more transformers, such as one or more so-called "coreless" transformers that use two stacked windings. Alternatively or additionally, galvanic isolation of one or more components of driver circuit 402 may use one or more capacitors to achieve capacitive galvanic isolation. In still other examples, galvanic isolation of one or more components of driver circuit 402 may use an inductive sender and a magnetic receiver. Optical signals and optocouplers could also be used for communication across a galvanic barrier. These or other components may be used to ensure that components of driver circuit 402 are each separated with a galvanic barrier.

Primary side pins 452, 454, and 456 may be connected to a microcontroller (e.g., controller 106 of FIG. 1) so that the microcontroller can send and receive information for controlling driver circuit 402. The microcontroller may send commands via pin 456 to gate driver 408 of driver circuit 402. Based on the input commands, gate driver 408 may be configured to deliver drive signals from an output pin 464 to power switch 450 to control ON/OFF switching of the power switch. A resistor 420 may be positioned between output pin 464 and the gate of power switch 450. A ground pin 466 of driver circuit 402 may be connected to a reference voltage (e.g., ground).

Driver circuit 402 may comprise a first detection pin 460 configured to receive a first signal associated with the power switch, wherein the first signal indicates a voltage drop over power switch 450 and a voltage drop over one or more other circuit elements (e.g., resistor 411A and diode 412A). In the example shown in FIG. 4, the first detection pin 460 is connected to the same circuit node as a so-called DESAT pin 458 that is connected to DESAT logic 404 of driver circuit 402. DESAT logic 404 may comprise protection logic that is configured to detect whether power switch 450 is in a desaturation mode based on a magnitude of the first signal. Gate driver 408 may be configured to disable power switch 450 in response to DESAT logic 404 detecting that power switch 450 is in the desaturation mode. Although first detection pin 460 and DESAT pin 458 are illustrated separately in FIG. 4, in some examples, first detection pin 460 and DESAT pin 458 may be a common pin of driver circuit 402.

In addition to first detection pin 460, driver circuit 402 also includes a second detection pin configured to receive a second signal, wherein the second signal indicates a voltage drop over one or more matched circuit elements (e.g., resister 411B and diode 412B). The one or more matched circuit elements (e.g., resister 411B and diode 412B). associated with the second signal are substantially identical to the one or more other circuit elements (e.g., resister 411A and diode 412A) associated with the first signal. Driver circuit 402 may be configured to determine a voltage drop over power switch 450 based on a difference between the first signal and the second signal. In particular, differential ADC 406 may receive the first signal and the second signal via pins 460 and 462, and differential ADC 406 may output a signal on primary-side pin 454 that is indicative of the difference between the first signal and the second signal.

In order to perform checks on desaturation, DESAT logic 404 of driver circuit 402 may comprise a first current source configured to deliver a first current (shown as Idesat) on DESAT pin 458. Again, DESAT pin 458 and first detection pin 460 may be combined as a single pin in some examples. Differential ADC 406 may comprise a second current source that is matched with the first current source and is configured to deliver a second current (shown as Idesat') on the second detection pin 462. The first current source and the second current source are matched so that the first current and the second current are substantially similar. The output of differential ADC 406 may comprise an indication of the voltage drop over power switch 450, and this indication may be communicated to a controller (e.g., controller 106 of FIG. 1) that controls driver circuit 402. By matching the first and second current sources, and by matching the other circuit elements 411A, 412A with the additional circuit elements 411B, 412B, the circuit is configured to eliminate the voltage drop that would otherwise be caused by the other circuit elements 411A, 412A, which can result in a more accurate voltage measurement of the voltage drop over power switch 450.

In the example of FIG. 4, the other circuit elements 411A, 412A comprise a first diode 412 and a first resistor 412, and the one or more additional circuit elements 411B, 412B that are matched to elements 411A, 412A comprise a second diode 412B and a second resistor 411B. The elements are matched in the sense that the exhibit similar or identical temperature coefficients exhibit similar voltage drop versus current behavior. Matched circuit elements 411B, 412B associated with the second signal, for example, may comprise circuit elements that have a same manufacturer part number as the one or more other circuit elements 411A, 412A that affect the signal on the DESAT pin 458. In other words, first diode 412A and second diode 412B may have a same first circuit part identification number, and first resistor 411A and second resistor 411B may have a same second circuit part identification number.

With the circuit shown in FIG. 4, the voltage drop caused by circuit elements 411A, 412A can be negated by a corresponding voltage drop in circuit elements 411B, 412B, and this negation may also be temperature dependent. In other words, a change in resistance of circuit elements 411A, 412A due to temperature would also cause a similar change in resistance of circuit elements 411B, 412B. Accordingly, even with changes in temperature, the circuit shown in FIG. 4 may provide very accurate measurements of the voltage drop over power switch 450.

Power switch 452 and 450 may each comprise a silicon metal oxide semiconductor field effect transistors (MOSFET), a silicon carbide (SiC) MOSFET, or a gallium nitride (GaN) MOSFET. These types of power switches are useful for controlling multiphase electric motors, such as those used with electric vehicles.

In some examples, driver circuit 402 may be configured to control or adjust the ON/OFF switching of the power switch 450 based on the determined voltage drop, which according to this disclosure, may comprise a more accurate determination of the voltage drop than can be achieved with other techniques. Since circuit elements 411B, 412B are matched with circuit elements 411A, 412A, the voltage drop over these elements can be negated by differential ADC 406 so as to provide a very accurate measurement of the voltage drop over power switch 450. Again, in some examples, driver circuit 402 may be capable of detecting problems in circuit operation, e.g., a safety check or disaster check on power switch operation based on the determined voltage drop over power switch 450.

Moreover, in some cases, the accurate voltage measurements can be communicated (via pin 454) to a controller (along with current measurements from current sensing units 202A, 202B, 202C), so that the controller can use these measurements in controlling power switch operation, performing safety or disaster checks, or possibly to determine the resistance of the power switch based on Ohm's law. The resistance, in turn, can be mapped to an indication of temperature of the power switch which may comprise a more precise indication of junction temperature of the power switch that can be achieved using other techniques. Accordingly, in some examples, the techniques of this disclosure can facilitate a controller to perform very accurate determinations of the temperature of a power switch.

For example, via pin 454, a controller (not shown in FIG. 4) may be configured to receive the indication of the voltage drop over power switch 450. The controller may also receive an indication of current through power switch 450 (e.g., from a current sensing unit that forms part of a current control loop), and calculate a resistance of the power switch based on the indication of the voltage drop and the indication of the current, such as by applying Ohm's law. The controller may be configured to determine a temperature of the power switch based on the calculated resistance, and to control driver circuit 402 based on the determined temperature.

Also, in some cases, a safety check or disaster check on the operation of power switch 450 can be performed by the controller based on the determined voltage drop over power switch 450. In other words, either the driver itself, or the controller that sends commands to the driver may perform safety checks or disaster checks on the operation of power switch 450 based on the determined voltage drop.

Although a differential ADC 406 is shown in FIG. 4, the differential ADC may be replaced by a non-differential ADC that samples first detection pin 460 and second detection pin 462 at different time instances, and a separate unit may be used to differentiate the different sample. This may simplify the circuit relative to the use of a differential ADC 406, which may be desirable for some applications.

Figure 5:
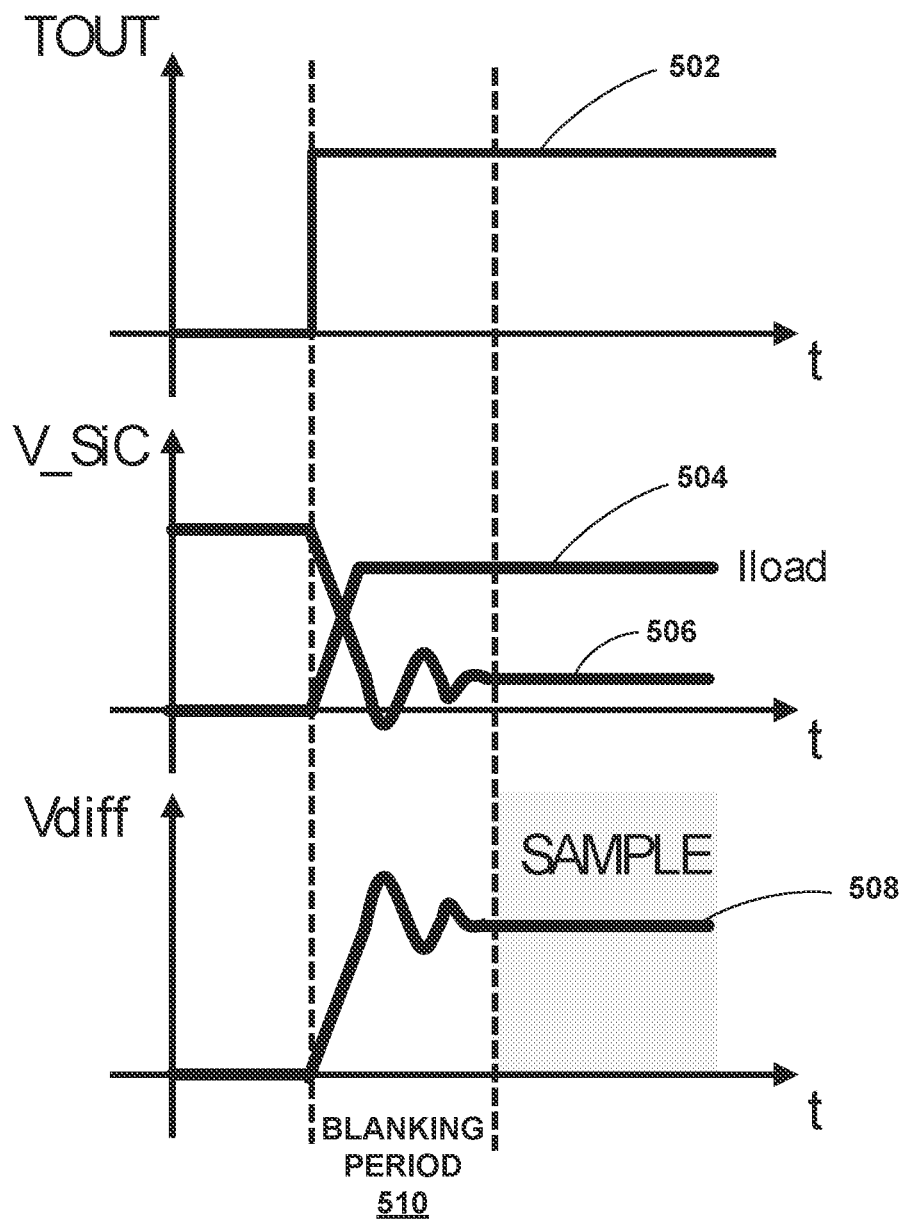
FIG. 5 is a graph showing measurement of a differential voltage signal after a blanking period.

The timing of measurements on first detection pin 460 and second detection pin may occur during operation of power switch 450. In doing so, as shown in FIG. 5, to account for signal noise due to switch operation, it is desirable to implement a brief blanking period 510. In other words, upon sending a control signal 502 to turn on the power switch, the circuit may be configured to wait for a blanking period 510 before measuring any sample 508. The blanking period 510 allows the signals to reach a steady state after some switching noise shown in the voltage signal 506 and after current 504 delivered to the load (e.g., motor 220) reaches a steady state.

Figure 6:
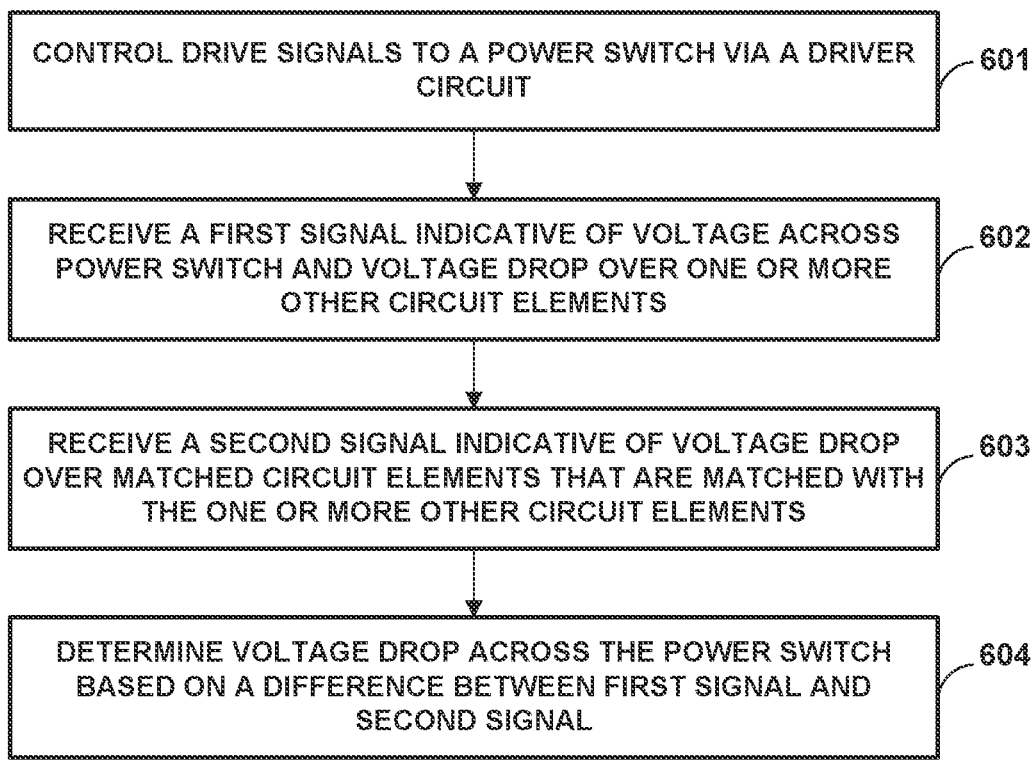
FIGS. 6 and 7 are example flow diagrams showing techniques consistent with the teaching of this disclosure.
Figure 7:
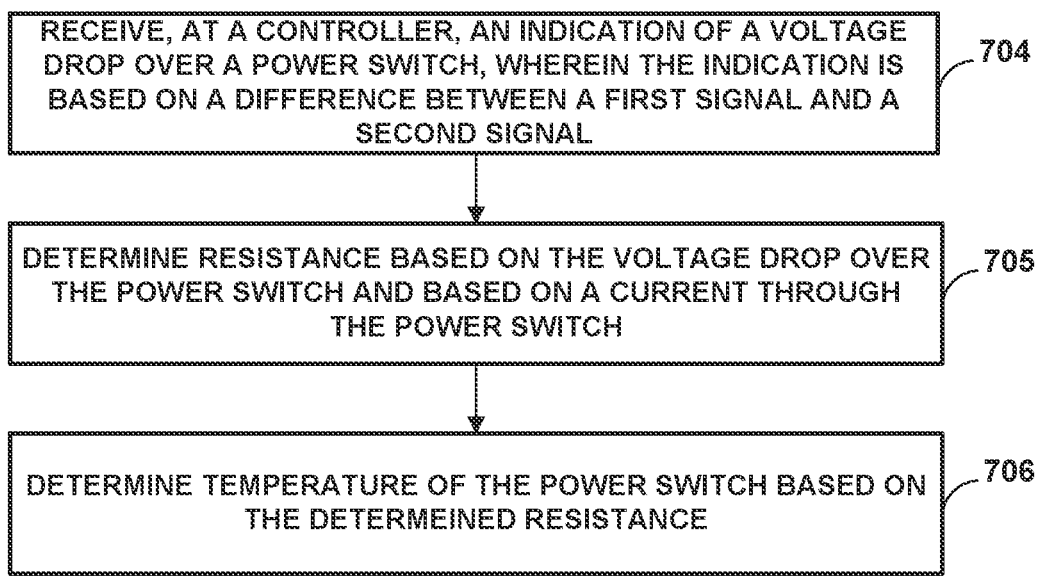

FIGS. 6 and 7 are example flow diagrams showing techniques consistent with the teaching of this disclosure. FIG. 6 demonstrates one technique that may be performed by a driver circuit, such as driver circuit 102 of FIG. 1 or driver circuit 402 of FIG. 4. As shown in FIG. 6, driver circuit 102, 402 controls drive signals to a power switch 126, 450 (601), i.e., to control the ON/OFF switching of the power switch 126, 450. Driver circuit 102, 402 receives a first signal indicative of a voltage drop across the power switch 126, 450 and voltage drop over one or more other circuit elements 122, 411A and 412A (602). In addition, driver circuit 102, 402 receives a second signal indicative of voltage drop over matched circuit elements 124, 411B and 412B (603). The matched circuit elements 124, 411B and 412B are matched with other circuit elements 122, 411A and 412A insofar as they are similar or identical, e.g., and matched circuit elements 124, 411B and 412B may have the same manufacturer part numbers as circuit elements 122, 411A and 412A. Driver circuit 102, 402 is configured to determine the voltage drop across the power switch 126, 450 based on a difference between the first signal and the second signal.

Driver circuit 102, 402 or a controller 106 that controls driver circuit 102 may control the power switch 126, 450 based on the measured voltage drop. As noted, above, the accurate voltage measurements can be used by driver circuit 102, 402 to detect problems in circuit operation, e.g., a safety check or disaster check on power switch operation. Normal switch operation, as one specific example, may exhibit voltage drops between 0.7V and 4V. A voltage drop less than these normal operational values may indicate failure in a component such as an internal current sources DESAT logic 404 or differential ADC 406 that generate Idesat and Idesat' shown in FIG. 4. Alternatively, a voltage drop higher than these normal operational values may indicate an open pin or an overheated power switch. The driver or the controller may be configured to respond to such conditions by taking steps to protect the circuit or by disabling the power switch.

Moreover, in some cases, the accurate voltage measurements can be communicated to a controller (along with current measurements), so that the controller can use these measurements in controlling switch operation, performing safety or disaster checks, or possibly to determine the resistance of the power switch based on Ohm's law. The resistance, in turn, can be mapped to an indication of temperature of the power switch which may be a more precise indication of junction temperature of the power switch that can be achieved using other techniques. Accordingly, in some examples, the techniques can facilitate very accurate measurements of the temperature of a power switch.

FIG. 7 is a flow diagram showing operation of a controller 106 in determining the temperature of a power switch according to this disclosure. As shown, controller 106 receives an indication of a voltage drop over a power switch 126, wherein the voltage drop is based on a difference between a first signal and a second signal (704). The first signal indicates a voltage drop over the power switch 126 and a voltage drop over one or more other circuit elements 122, and the second signal indicates a voltage drop over one or more matched circuit elements 124, wherein the one or more matched circuit elements 124 associated with the first signal are substantially identical to the one or more other circuit elements 122 associated with the second signal. Controller 106 determines resistance based on a voltage drop over the power switch 126 and based on current through the power switch 126 (705), e.g., by applying Ohm's law. Controller 106 may then determine temperature of the power switch based on the determined resistance (706), e.g., by applying a mathematical relationship or a lookup table that maps resistance to temperature such as shown in the graph of FIG. 3.

FIG. 7 has been described from the perspective of controller 106. Controller 106 may be implemented in any combination of integrated circuitry, discrete logic circuitry, analog circuitry, such as one or more microprocessors, digital signal processors (DSPs), application specific integrated circuits (ASICs), and/or field-programmable gate arrays (FPGAs). In some examples, controller 106 may include multiple components, such as any combination of one or more microprocessors, one or more DSPs, one or more ASICs, or one or more FPGAs, as well as other discrete or integrated logic circuitry, and/or analog circuitry.

One or more of the techniques described in this disclosure may also be encoded in instructions and data stored to a non-transitory computer-readable storage medium, such as memory associated with controller 106. In this case, the instructions may be executed by one or more processors (e.g., controllers 106). Example non-transitory computer-readable storage media may include random access memory (RAM), read only memory (ROM), programmable ROM (PROM), erasable programmable ROM (EPROM), electronically erasable programmable ROM (EEPROM), flash memory, magnetic media, optical media, or any other computer readable storage devices or tangible computer readable media. The term "non-transitory" may indicate that the storage medium is not embodied in a carrier wave or a propagated signal. In certain examples, a non-transitory storage medium may store data that can, over time, change (e.g., in RAM or cache).

The following clauses may illustrate one or more aspects of the disclosure.

Clause 1—A driver circuit configured to control a power switch, the driver circuit comprising: an output pin, wherein the driver circuit is configured to deliver drive signals from the output pin to the power switch to control ON/OFF switching of the power switch; a first detection pin configured to receive a first signal associated with the power switch, wherein the first signal indicates a voltage drop over the power switch and a voltage drop over one or more other circuit elements; and a second detection pin configured to receive a second signal, wherein the second signal indicates a voltage drop over one or more matched circuit elements, wherein the one or more matched circuit elements associated with the second signal are substantially identical to the one or more other circuit elements associated with the first signal, wherein the driver circuit is configured to determine the voltage drop over the power switch based on a difference between the first signal and the second signal.

Clause 2—The driver circuit of clause 1, wherein the driver circuit comprises a differential analog-to-digital converter (ADC) configured to output a signal indicative of the difference between the first signal and the second signal.

Clause 3—The driver circuit of clause 1 or 2, wherein the driver circuit comprises a first current source configured to deliver a first current on the first detection pin and a second current source configured to deliver a second current on the second detection pin, wherein the first current source and the second current source are matched so that the first current and the second current are substantially similar.

Clause 4—The driver circuit of any of clauses 1-3, wherein the driver circuit is configured to output an indication of the voltage drop over the power switch to a controller that controls the driver circuit.

Clause 5—The driver circuit of any of clauses 1-4, wherein the one or more other circuit elements comprise a first diode and a first resistor and the one or more matched circuit elements comprise a second diode and a second resistor.

Clause 6—The driver circuit of clause 5, wherein the first diode and the second diode have a same first circuit part identification number and the first resistor and the second resistor have a same second circuit part identification number.

Clause 7—The driver circuit of any of clauses 1-6, wherein first detection pin comprises a desaturation (DE-SAT) detection pin, the driver circuit further comprising protection logic that is configured to detect whether the power switch is in a desaturation mode based on a magnitude of the first signal and disable the power switch in response to detecting that the power switch is in the desaturation mode.

Clause 8—The driver circuit of any of clauses 1-7, wherein the power switch comprises: a silicon metal oxide semiconductor field effect transistor (MOSFET); a silicon carbide (SiC) MOSFET; or a gallium nitride (GaN) MOSFET.

Clause 9—The driver circuit of any of clauses 1-8, wherein the driver circuit is configured to control the ON/OFF switching of the power switch based on the determined voltage drop over the power switch.

Clause 10—A system comprising: a controller; and a driver circuit configured to control a power switch based on control signals from the controller, the driver circuit comprising: an output pin, wherein the driver circuit is configured to deliver drive signals from the output pin to the power switch to control ON/OFF switching of the power switch; a first detection pin configured to receive a first signal associated with the power switch, wherein the first signal indicates a voltage drop over the power switch and a voltage drop over one or more other circuit elements; and a second detection pin configured to receive a second signal, wherein the second signal indicates a voltage drop over one or more matched circuit elements, wherein the one or more matched circuit elements associated with the second detection pin are substantially identical to the one or more other circuit elements associated with the first detection pin, wherein the driver circuit is configured to determine the voltage drop over the power switch based on a difference between the first signal and the second signal and send an indication of the voltage drop to the controller.

Clause 11—The system of clause 10, wherein the controller is configured to: receive the indication of the voltage drop over the power switch; receive an indication of current through the power switch; and calculate a resistance of the power switch based on the indication of the voltage drop over the power switch and the indication of the current.

Clause 12—The system of clause 11, wherein the controller is configured to determine a temperature of the power switch based on the calculated resistance.

Clause 13—The system of clause 12, wherein the controller is configured to control the driver circuit based on the determined temperature.

Clause 14—The system of any of clauses 10-13, wherein the one or more other circuit elements comprise a first diode and a first resistor and the one or more matched circuit elements comprise a second diode and a second resistor.

Clause 15—The system of clause 14, wherein the first diode and the second diode have a same first circuit part identification number and the first resistor and the second resistor have a same second circuit part identification number.

Clause 16—The system of any of clauses 10-15, further comprising the power switch.

Clause 17—The system of any of clauses 10-16, further comprising a plurality of driver circuits configured to control a plurality of power switches, wherein the plurality of power switches are configured to control operation of a multi-phase electrical motor.

Clause 18—The system of any of clauses 10-17, wherein the controller is configured to define the control signals based on the determined voltage drop over the power switch.

Clause 19—A method comprising: controlling ON/OFF switching of a power switch; receiving a first signal associated with the power switch, wherein the first signal indicates a voltage drop over the power switch and a voltage drop over one or more other circuit elements; receiving a second signal, wherein the second signal indicates a voltage drop over one or more matched circuit elements, wherein the one or more matched circuit elements associated with the first signal are substantially identical to the one or more other circuit elements associated with the second signal; and determining a voltage drop over the power switch based on a difference between the first signal and the second signal.

Clause 20—The method of clause 19, further comprising: controlling the power switch based on the determined voltage drop over the power switch.

Clause 21—The method of clause 19 or 20, further comprising: calculating a resistance of the power switch based on the indication of the voltage drop over the power switch and an indication of current through the power switch.

Clause 22—The method of clause 21, further comprising: determining a temperature of the power switch based on the calculated resistance.

Various aspects have been described in this disclosure. These and other aspects are within the scope of the following claims.

The invention claimed is:

1. A driver circuit configured to control a power switch, the driver circuit comprising:
   an output pin, wherein the driver circuit is configured to deliver drive signals from the output pin to the power switch to control ON/OFF switching of the power switch;
   a first detection pin and a first current source configured to deliver a first current from the driver circuit on the first detection pin, wherein the first detection pin is configured to receive a first signal associated with the power switch, wherein the first signal indicates a voltage drop over the power switch and a voltage drop over one or more other circuit elements;
   a second detection pin and a second current source configured to deliver second current from the driver circuit on the second detection pin, wherein the first current source and the second current source are matched so that the first current and the second current are substantially similar, and wherein the second detection pin is configured to receive a second signal, wherein the second signal indicates a voltage drop over one or more matched circuit elements, wherein the one or more matched circuit elements associated with the second signal are substantially identical to the one or more other circuit elements associated with the first signal; and
   a differential analog-to-digital converter (ADC) configured to determine the voltage drop over the power switch based on a difference between the first signal and the second signal and output a signal indicative of the difference between the first signal and the second signal to a controller that controls the driver circuit.

2. The driver circuit of claim 1, wherein the ADC is configured to output a signal indicative of the difference between the first signal and the second signal.

3. The driver circuit of claim 2, wherein the first detection pin comprises a desaturation (DESAT) detection pin and the driver circuit further comprising protection logic that is configured to detect whether the power switch is in a desaturation mode based on a magnitude of the first signal, wherein the protection logic includes the first current source.

4. The driver circuit of claim 1, wherein the one or more other circuit elements comprise a first diode and a first resistor and the one or more matched circuit elements comprise a second diode and a second resistor.

5. The driver circuit of claim 4, wherein the first diode and the second diode have a same first circuit part identification number and the first resistor and the second resistor have a same second circuit part identification number.

6. The driver circuit of claim 1, wherein the first detection pin comprises a desaturation (DESAT) detection pin, the driver circuit further comprising protection logic that is configured to detect whether the power switch is in a desaturation mode based on a magnitude of the first signal and disable the power switch in response to detecting that the power switch is in the desaturation mode.

7. The driver circuit of claim 1, wherein the power switch comprises:
   a silicon metal oxide semiconductor field effect transistor (MOSFET);
   a silicon carbide (SiC) MOSFET; or
   a gallium nitride (GaN) MOSFET.

8. The driver circuit of claim 1, wherein the driver circuit is configured to control the ON/OFF switching of the power switch based on the determined voltage drop over the power switch.

9. The driver circuit of claim 3, further comprising a third detection pin is connected to a same node as the first detection pin such that the second signal is detectable on both the first detection pin and the third detection pin, wherein the first detection pin is connected to the protection logic and wherein the second detection pin and the third detection pin are connected to the differential ADC.

10. A system comprising:
    a controller; and
    a driver circuit configured to control a power switch based on control signals from the controller, the driver circuit comprising:

an output pin, wherein the driver circuit is configured to deliver drive signals from the output pin to the power switch to control ON/OFF switching of the power switch;
a first detection pin and a first current source configured to deliver a first current from the driver circuit on the first detection pin, wherein the first detection pin is configured to receive a first signal associated with the power switch, wherein the first signal indicates a voltage drop over the power switch and a voltage drop over one or more other circuit elements;
a second detection pin and a second current source configured to deliver second current from the driver circuit on the second detection pin, wherein the first current source and the second current source are matched so that the first current and the second current are substantially similar, and wherein the second detection pin is configured to receive a second signal, wherein the second signal indicates a voltage drop over one or more matched circuit elements, wherein the one or more matched circuit elements associated with the second detection pin are substantially identical to the one or more other circuit elements associated with the first detection pin; and
a differential analog-to-digital converter (ADC) configured to determine the voltage drop over the power switch based on a difference between the first signal and the second signal and send an indication of the voltage drop to the controller.

11. The system of claim 10, wherein the controller is configured to:
receive the indication of the voltage drop over the power switch;
receive an indication of current through the power switch; and
calculate a resistance of the power switch based on the indication of the voltage drop over the power switch and the indication of the current.

12. The system of claim 11, wherein the controller is configured to determine a temperature of the power switch based on the calculated resistance.

13. The system of claim 12, wherein the controller is configured to control the driver circuit based on the determined temperature.

14. The system of claim 10, wherein the one or more other circuit elements comprise a first diode and a first resistor and the one or more matched circuit elements comprise a second diode and a second resistor.

15. The system of claim 14, wherein the first diode and the second diode have a same first circuit part identification number and the first resistor and the second resistor have a same second circuit part identification number.

16. The system of claim 10, further comprising the power switch.

17. The system of claim 10, further comprising a plurality of driver circuits configured to control a plurality of power switches, wherein the plurality of power switches are configured to control operation of a multi-phase electrical motor.

18. The system of claim 10, wherein the controller is configured to define the control signals based on the determined voltage drop over the power switch.

19. A method comprising:
controlling ON/OFF switching of a power switch via a driver circuit;
delivering a first current from the driver circuit on a first detection pin;
receiving a first signal on the first detection pin, wherein the first signal indicates a voltage drop over the power switch and a voltage drop over one or more other circuit elements;
delivering a second current from the driver circuit on a second detection pin, wherein the first current and the second current are substantially similar;
receiving a second signal on the second detection pin, wherein the second signal indicates a voltage drop over one or more matched circuit elements, wherein the one or more matched circuit elements associated with the first signal are substantially identical to the one or more other circuit elements associated with the second signal;
determining, via a differential analog-to-digital converter (ADC), a voltage drop over the power switch based on a difference between the first signal and the second signal; and
outputting a signal indicative of the difference between the first signal and the second signal to a controller that controls the driver circuit.

20. The method of claim 19, further comprising:
controlling the power switch based on the determined voltage drop over the power switch.

21. The method of claim 19, further comprising:
calculating a resistance of the power switch based on the indication of the voltage drop over the power switch and an indication of current through the power switch.

22. The method of claim 21, further comprising:
determining a temperature of the power switch based on the calculated resistance.

* * * * *